United States Patent
Yang et al.

(10) Patent No.: US 8,335,083 B2
(45) Date of Patent: *Dec. 18, 2012

(54) APPARATUS AND METHOD FOR THERMAL MANAGEMENT USING VAPOR CHAMBER

(75) Inventors: Wei Yang, Minnetonka, MN (US); Steven J. Eickhoff, Brooklyn Park, MN (US); Chunbo Zhang, Plymouth, MN (US); Alex Gu, Plymouth, MN (US); J. David Zook, Golden Valley, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/909,669

(22) Filed: Oct. 21, 2010

(65) Prior Publication Data

US 2011/0030925 A1 Feb. 10, 2011

Related U.S. Application Data

(63) Continuation of application No. 12/169,793, filed on Jul. 9, 2008, now Pat. No. 7,843,695.

(60) Provisional application No. 60/961,476, filed on Jul. 20, 2007.

(51) Int. Cl.
*H05K 7/20* (2006.01)
*H01L 23/34* (2006.01)
*H01L 23/367* (2006.01)
*F28D 15/00* (2006.01)

(52) U.S. Cl. ............ 361/702; 361/679.53; 361/679.54; 361/709; 361/710; 361/711; 361/718; 165/104.33; 257/713; 257/714

(58) Field of Classification Search ............. 361/679.53, 361/679.54, 699–702, 709–711, 718; 165/104.33; 257/707, 713, 714

See application file for complete search history.

(56) References Cited

U.S. PATENT DOCUMENTS 4,685,512 A 8/1987 Edelstein et al.
(Continued)

FOREIGN PATENT DOCUMENTS

EP 466363 A1 1/1992

OTHER PUBLICATIONS

Sreekar Bhaviripudi, et al., "Block-copolymer assisted synthesis of arrays of metal nanoparticles and their catalytic activities for the growth of SWNTs", Institute of Physics Publishing, Nanotechnology 17 (2006), p. 5080-5086.

(Continued)

*Primary Examiner* — Anatoly Vortman

(57) ABSTRACT

An apparatus includes a plurality of islands each carrying multiple cantilevers. The apparatus also includes a fluidic network having a plurality of channels separating the islands. The channels are configured to provide fluid to the islands, and the fluid at least partially fills spaces between the cantilevers and the islands. Heat from the islands vaporizes the fluid filling the spaces between the cantilevers and the islands to transfer the heat away from the islands while driving the cantilevers into oscillation. The apparatus may also include a casing configured to surround the islands and the fluidic network to create a vapor chamber, where the vapor chamber is configured to retain the vaporized fluid. The islands and the fluidic network could be formed in a single substrate, or the islands could be separate and attached together by a binder located within the channels of the fluidic network.

21 Claims, 3 Drawing Sheets

U.S. PATENT DOCUMENTS

| | | | |
|---|---|---|---|
| 5,239,200 A | | 8/1993 | Messina et al. |
| 5,482,564 A * | | 1/1996 | Douglas et al. ............... 134/18 |
| 5,661,591 A * | | 8/1997 | Lin et al. ...................... 359/290 |
| 5,719,695 A * | | 2/1998 | Heimbuch .................... 359/291 |
| 5,867,202 A * | | 2/1999 | Knipe et al. .................. 347/239 |
| 6,072,617 A * | | 6/2000 | Henck .......................... 359/237 |
| 6,118,124 A * | | 9/2000 | Thundat et al. .............. 250/332 |
| 6,215,644 B1 * | | 4/2001 | Dhuler .......................... 361/280 |
| 6,330,745 B1 | | 12/2001 | Cromwell et al. |
| 6,473,361 B1 * | | 10/2002 | Chen et al. ................... 365/244 |
| 6,598,409 B2 | | 7/2003 | Shyy et al. |
| 6,661,561 B2 * | | 12/2003 | Fitzpatrick et al. .......... 359/291 |
| 6,766,817 B2 | | 7/2004 | da Silva |
| 6,781,056 B1 | | 8/2004 | O'Rourke et al. |
| 6,994,151 B2 | | 2/2006 | Zhou et al. |
| 7,027,304 B2 | | 4/2006 | Aisenbrey |
| 7,188,662 B2 | | 3/2007 | Brewer et al. |
| 7,212,405 B2 | | 5/2007 | Prasher et al. |
| 7,247,248 B2 * | | 7/2007 | Tee et al. ...................... 216/11 |
| 7,265,979 B2 | | 9/2007 | Erturk et al. |
| 7,277,065 B2 * | | 10/2007 | Wu et al. ...................... 343/909 |
| 7,285,255 B2 | | 10/2007 | Kadlec et al. |
| 7,289,326 B2 | | 10/2007 | Heydari et al. |
| 7,340,941 B1 * | | 3/2008 | Fruhberger et al. .......... 73/24.01 |
| 7,355,777 B2 * | | 4/2008 | Oden et al. ................... 359/245 |
| 7,365,981 B2 | | 4/2008 | Myers et al. |
| 7,405,852 B2 * | | 7/2008 | Brosnihan et al. .......... 359/198.1 |
| 7,411,187 B2 * | | 8/2008 | Monroe et al. ............... 250/290 |
| 7,411,717 B2 * | | 8/2008 | Patel et al. .................... 359/290 |
| 7,414,843 B2 | | 8/2008 | Joshi et al. |
| 7,414,953 B2 * | | 8/2008 | Rust et al. ..................... 369/126 |
| 7,425,749 B2 * | | 9/2008 | Hartzell et al. ............... 257/414 |
| 7,453,187 B2 * | | 11/2008 | Richards et al. .............. 310/339 |
| 7,483,198 B2 * | | 1/2009 | Doan et al. ................... 359/291 |
| 7,538,422 B2 | | 5/2009 | Dangelo et al. |
| 7,591,302 B1 | | 9/2009 | Lenehan et al. |
| 7,612,932 B2 * | | 11/2009 | Chui et al. .................... 359/290 |
| 7,732,918 B2 | | 6/2010 | Dangelo et al. |
| 7,771,803 B2 * | | 8/2010 | Daniel et al. .................. 428/17 |
| 2001/0002872 A1 * | | 6/2001 | Dhuler .......................... 361/277 |
| 2002/0135857 A1 * | | 9/2002 | Fitzpatrick et al. .......... 359/291 |
| 2004/0080913 A1 | | 4/2004 | Zeighami et al. |
| 2004/0093887 A1 | | 5/2004 | Shyy et al. |
| 2004/0179338 A1 | | 9/2004 | Belady et al. |
| 2004/0250994 A1 | | 12/2004 | Chordia |
| 2005/0098299 A1 | | 5/2005 | Goodson et al. |
| 2005/0117301 A1 | | 6/2005 | Prasher et al. |
| 2005/0200001 A1 | | 9/2005 | Joshi et al. |
| 2005/0205241 A1 | | 9/2005 | Goodson et al. |
| 2005/0214196 A1 | | 9/2005 | Ohashi et al. |
| 2005/0225213 A1 * | | 10/2005 | Richards et al. .............. 310/339 |
| 2006/0087064 A1 * | | 4/2006 | Daniel et al. .................. 267/102 |
| 2006/0134831 A1 | | 6/2006 | Cohen et al. |
| 2007/0036978 A1 | | 2/2007 | Chen |
| 2008/0137299 A1 | | 6/2008 | Zhang et al. |

OTHER PUBLICATIONS

Sreekar Bhaviripudi, et al., "CVD Synthesis of Single-Walled Carbon Nanotubes from Gold Nanoparticles Catalysts", Journal of American Chemical Society, (2007), p. 1516-1517.

Quanfang Chen, et al., "Exploration study of multifunctional metallic nanocomposite utilizing single-walled carbon nanotubes for micro/nano devices", Proc. IMechE, vol. 219, Part N, Jan. 20, 2006, p. 67-72.

Jie Zheng, et al., "Transport of a liquid water and methanol mixture through carbon nanotubes under a chemical potential gradient", The Journal of Chemical Physics 122, (2005), 7 pages.

B. Poulaert, et al., "Thermal conductivity of highly oriented polyethylene fibres", Polymer Communication, vol. 31, Apr. 1990, p. 148-151.

Chris Dames, et al., "1ω, 2ω, and 3ω methods for measurements of thermal properties", Review of Scientific Instruments 76, (2005), 14 pages.

"Therma-Base", www.thermacore.com, (2008), 3 pages.

Stefano Lepri, et al., "Thermal conduction in classical low-dimensional lattices", Physics Reports 377 (2003), p. 1-80.

Hao Lin, et al., "Instability of electrokinetic microchannel flows with conductivity gradients", Physics of Fluids, vol. 16, No. 6, Jun. 2004, p. 1922-1935.

Hao Lin, et al., "Inertially driven inhomogeneities in violently collapsing bubbles: the validity of the Rayleigh-Plesset equation", J. Fluid Mech. (2002), vol. 452, p. 145-162.

Notification of Transmittal of the International Search Report and the Written Opinion of the International Searching Authority, or the Declaration dated Mar. 17, 2009 in connection with PCT Application No. PCT/US2008/069773.

Evelyn N. Wang, et al., "A hybrid method for bubble geometry reconstruction in two-phase microchannels", Experiments in Fluids (2006), 12 pages.

Evelyn N. Wang, et al., "Micromachined Jets for Liquid Impingement Cooling of VLSI Chips", Journal of Microelectromechanical Systems, vol. 13, No. 5, Oct. 2004, p. 833-842.

Gang Chen, "Nanoscale Heat Transfer and Nanostructured Thermoelectrics", IEEE Transactions on Components and Packaging Technologies, vol. 29, No. 2, Jun. 2006, p. 238-246.

Hao Lin, et al., "Rayleigh-Taylor instability of violently collapsing bubbles", Physics of Fluids, vol. 14, No. 8, Aug. 2002, p. 2925-2928.

* cited by examiner

APPARATUS AND METHOD FOR THERMAL MANAGEMENT USING VAPOR CHAMBER

CROSS-REFERENCE TO RELATED APPLICATIONS

This application is a continuation of prior U.S. patent application Ser. No. 12/169,793 filed on Jul. 9, 2008 (now U.S. Pat. No. 7,843,695) claiming priority under 35 U.S.C. §119(e) to U.S. Provisional Patent Application No. 60/961,476 filed on Jul. 20, 2007, which is hereby incorporated by reference.

TECHNICAL FIELD

This disclosure relates generally to thermal management and more specifically to an apparatus and method for thermal management using a vapor chamber.

BACKGROUND

Aggressive advances in electronic device technology, such as for defense and space applications, have created an urgent need for revolutionary thermal management solutions to effectively spread and carry heat dissipated by integrated circuit (IC) chips and multi-chip modules (MCMs). Some conventional thermal solutions use copper alloy heat spreaders, which draw heat away from integrated circuit chips and multi-chip modules and spread the heat over a larger area. However, these thermal solutions are often limited by the thermal conductivity (200 W/mK) and thermal expansion coefficient (TEC) mismatch of the copper alloy heat spreaders. Also, the lack of flexibility of the thermal substrate can limit innovative packaging configurations.

In other conventional thermal solutions, heat pipes are used to help transport heat generated by electronic systems. By their nature, heat pipes are well suited for both long distance transport and for heat flux transformation (accepting a high heat flux at the source and ejecting it as a low heat flux at some other location, usually with a minimal change in temperature). Most heat pipes used for electronics cooling are made with copper as the envelope material and water as the working fluid. Heat pipes are often made in both cylindrical tube shapes and in low profile cuboids called vapor chamber heat pipes. Heat pipes have a much higher effective thermal conductivity for long-distance transport (compared to copper), but heat pipers are less effective in short-distance transport due to wick thermal resistance. Although the wick thermal resistance can be reduced by using a thinner wick layer or a smaller pore size, this typically leads to reduced capacity to handle heat flux (such as critical heat flux) due to increased liquid flow resistance in the wick capillary.

SUMMARY

This disclosure provides an apparatus and method for thermal management using a vapor chamber.

In a first embodiment, an apparatus includes a plurality of islands each carrying multiple cantilevers. The apparatus also includes a fluidic network having a plurality of channels separating the islands. The channels are configured to provide fluid to the islands, and the fluid at least partially fills spaces between the cantilevers and the islands. Heat from the islands vaporizes the fluid filling the spaces between the cantilevers and the islands to transfer the heat away from the islands.

In particular embodiments, the apparatus also includes a casing configured to surround the islands and the fluidic network to create a vapor chamber. The vapor chamber is configured to retain the vaporized fluid. The casing could include a first portion and a second portion sealed together along outer sealing surfaces.

In other particular embodiments, the islands and the fluidic network are formed in a single substrate. In yet other particular embodiments, the islands include separate islands attached together by a binder located within the channels of the fluidic network. The binder could be selected to provide a desired amount of rigidity or flexibility.

In still other particular embodiments, the apparatus has an effective thermal conductivity of at least 20,000 watts per meter Kelvin (W/mK) and a critical heat flux of at least 500 watts per square centimeter (W/cm$^2$).

In additional particular embodiments, the islands include silicon, and the cantilevers represent T-shaped cantilevers and/or zigzag-shaped cantilevers.

In a second embodiment, a system includes a thermal ground plane (TGP) and integrated circuitry. The thermal ground plane includes a plurality of islands each carrying multiple cantilevers and a fluidic network having a plurality of channels separating the islands. The channels are configured to provide fluid to the islands, and the fluid at least partially fills spaces between the cantilevers and the islands. Heat from the integrated circuitry is absorbed by the islands and vaporizes the fluid filling the spaces between the cantilevers and the islands to transfer the heat away from the islands.

In a third embodiment, a method includes providing a fluid to one or more islands in a thermal ground plane, where the fluid at least partially fills spaces between cantilevers on the islands and the islands. The method also includes absorbing heat at the islands, where the heat is generated by one or more integrated circuit (IC) chips. In addition, the method includes transferring the heat from the islands to the fluid so as to vaporize the fluid in the spaces between the cantilevers and the islands. The vaporized fluid escapes from the spaces and is replaced by additional fluid.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
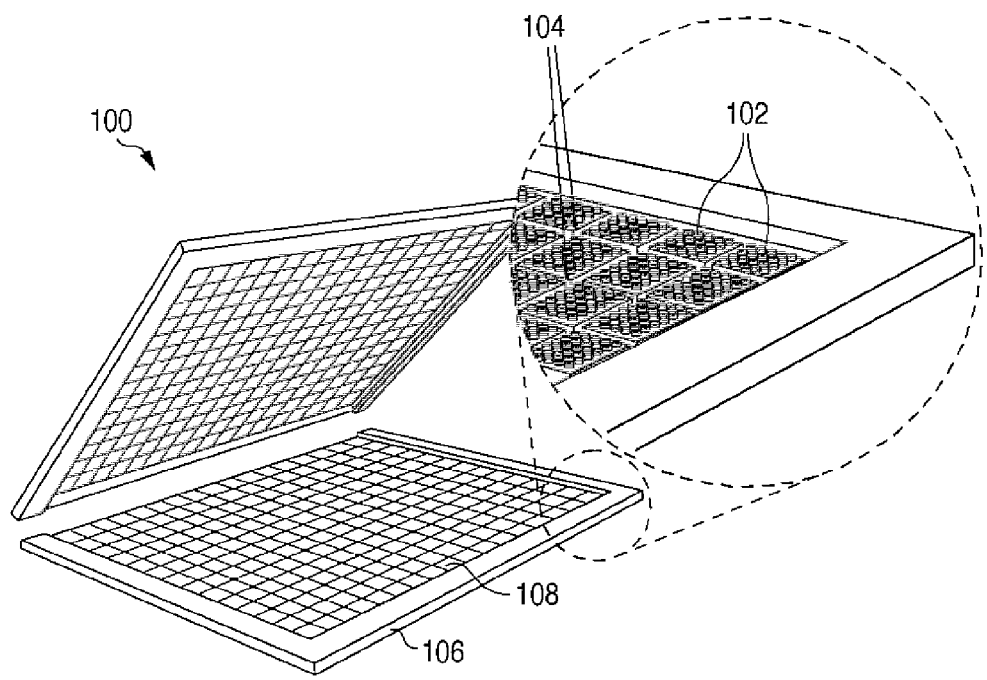
FIG. 1 illustrates an example vapor chamber thermal ground plane according to one embodiment of this disclosure.

FIG. 1 illustrates an example vapor chamber thermal ground plane 100 according to one embodiment of this disclosure. The embodiment of the vapor chamber thermal ground plane 100 shown in FIG. 1 is for illustration only. Other embodiments of the vapor chamber thermal ground plane 100 could be used without departing from the scope of this disclosure.

In this example, the thermal ground plane 100 includes a wick structure having multiple evaporative islands 102 separated from each other by a fluidic network 104. The evaporative islands 102 allow for high heat-transfer from the island base to the evaporative surface of a fluid. As described in more detail below, the evaporative islands 102 have small features (such as micro- or nano-engineered cantilevers) on their major exposed surfaces. These features facilitate a high fluid evaporation rate. Vapor condensation can take place anywhere within the thermal ground plane 100 where the temperature is lower, such as areas that are away from the heat source or close to an external cooling source. Once condensed, the fluid is transported by the fluidic network 104 back to the evaporative islands 102 by capillary forces. The fluid transported in the fluidic network 104 allows for continuous replenishment of fluid for the evaporative islands 102 and thus helps to sustain a continuous evaporation-condensation cycle. A casing 106 in thermal contact with the evaporative islands 102 encases the evaporative islands 102 and the fluidic network 104, forming a vapor chamber that contains the vapor produced by the evaporative islands 102. Note that islands 102 and a fluidic network 104 reside in each portion of the casing 106 as shown in FIG. 1.

As described in more detail below, fluid from the fluidic network 104 covers the evaporative islands 102. Part of the fluid enters various spaces between the features formed on the evaporative islands 102 (such as the cantilevers) and the evaporative islands 102 themselves. The fluid in those spaces is superheated and experiences explosive evaporation, which helps to pull heat away from the evaporative islands 102. New fluid then refills the spaces between the features formed on the evaporative islands 102 and the evaporative islands 102 themselves, and the process is repeated. In this way, the thermal ground plane 100 can pull heat away from integrated circuit chips, multi-chip modules, and other heat-generating devices in thermal contact with the casing 106.

The evaporative islands 102 include any suitable structures on which features can be formed to facilitate superheating and explosive evaporation of a fluid. The evaporative islands 102 could, for example, represent structures formed from silicon. The fluidic network 104 includes any suitable structures allowing transport of fluid to and from the evaporative islands 102, such as a high mass-transport microfluidic network. The case 106 includes any suitable structure for encasing the evaporative islands 102 and the fluidic network 104, such as a flexible, robust casing. The case 106 could, for example, represent a structure that offers structural, thermal expansion coefficient (TEC) matching, and electrically isolating properties, which can allow the mounting of integrated circuit chips or other circuitry directly onto the thermal ground plane 100. In this example, the case 106 includes a top portion and a bottom portion joined along outer sealing surfaces 10B of the two portions.

Note that there may be no predetermined evaporation or condensation areas of the thermal ground plane 100 since evaporation and condensation can occur anywhere within the thermal ground plane 100. The locations of evaporation and condensation could be determined by the external placement of heating and cooling elements. For example, a heat-generating device (such as an integrated circuit chip) can be placed anywhere on the external surface of the thermal ground plane 100, and the islands 102 in thermal contact with the heat source function as the evaporation surface. Likewise, areas of the thermal ground plane 100 in thermal contact with a cooling source (such as a heat sink) could function as condensation surfaces. In typical embodiments, the condensation area may be much larger than the evaporative area.

In some embodiments, the evaporative islands 102 cover approximately 80% of the total area of the wick structure. The structures formed on the evaporative islands 102 (such as the cantilevers) enable enhanced evaporation and a high capillary pressure. The fluidic network 104 provides long-range fluid transport paths with low resistance. This structured wick design can be optimized to achieve high critical heat flux levels (dry out limit) beyond conventional heat pipe limits. Also, the evaporation enhancement seeks to increase the evaporative mass flux for a given change in temperature ($\Delta T$) between the base and the evaporative surface, translating to a lower specific thermal resistance ($K \cdot cm^2/W$), which in high flux or short-range heat transfers tends to dominate the overall thermal resistance.

Among other things, this type of thermal ground plane 100 could represent a high performance, thin, and lightweight thermal ground plane, where high effective thermal conductivities (such as 20,000 W/mK) can be achieved and high heat fluxes (such as >500 W/cm$^2$) can be dissipated. Achieving this can involve various aspects of the thermal ground plane 100, such as materials synthesis, micro- and nano-scale heat transfer and thermal engineering, nanofabrication, microfluidics, multi-phase numerical modeling, and packaging.

This type of thermal ground plane 100 could be used in a wide variety of applications. For example, the thermal ground plane 100 can address or be used in space electronics systems, where weight and compactness are often critical issues. The thermal ground plane 100 can significantly enhance the packing density of IC chips on multiple MCM boards and enable novel thermal management solutions. As a particular example, one configuration involves allowing vapor transport from multiple individual thermal ground planes 100 to a larger vapor chamber heat sink/condenser, thus eliminating the bulky wedge structure currently used for thermal contact between a sink and copper alloy thermal bridges. In addition to these specified applications, the thermal ground plane 100 could be universally designed to offer significant advantages to address a multitude of other defense or other applications. Among other things, this may help to greatly enhance design flexibility, 2D/3D packing density, weight reduction, and device performance of space-borne systems. This may also enable much more compact and lighter-weight thermal management components, such as those manufactured for commercial computers. These uses are for illustration only. The vapor chamber thermal ground plane 100 could be used with any suitable device or system.

Although FIG. 1 illustrates one example of a vapor chamber thermal ground plane 100, various changes may be made to FIG. 1. For example, the thermal ground plane 100 could include any number of evaporative islands 102, and any suitable fluidic network with any suitable arrangement or pattern could be used.

Figure 2:
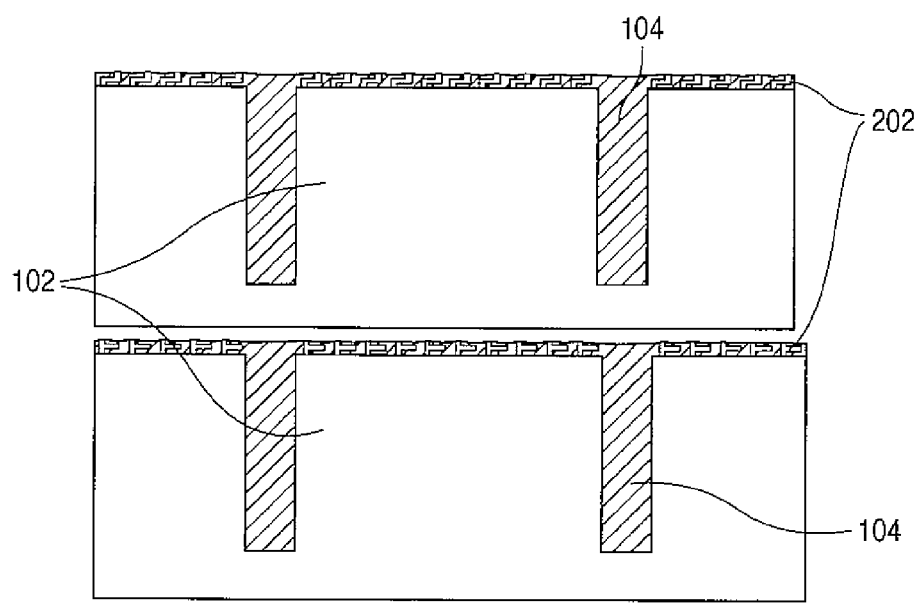
FIG. 2 illustrates additional details of an example vapor chamber thermal ground plane according to one embodiment of this disclosure.

FIG. 2 illustrates additional details of an example vapor chamber thermal ground plane 100 according to one embodiment of this disclosure. The additional details of the vapor chamber thermal ground plane 100 shown in FIG. 2 are for illustration only. Other embodiments of the vapor chamber thermal ground plane 100 could be used without departing from the scope of this disclosure.

In this example, the vapor chamber thermal ground plane 100 includes or supports a dynamic wick structure, which relies on thermally driven hydrodynamic instability to enhance heat transfer. The dynamic wick structure includes arrays of cantilevers 202 as shown in FIG. 2. The cantilevers 202 are formed on the evaporative islands 102, and fluid travels through the fluidic network 104 between the islands 102 and covers the cantilevers 202.

Under each cantilever 202 is a fluid-filled, semi-confined space (which could have a thickness in the submicron to micron scale). A semi-confinement condition due to surface tension, inertia, and flow resistance gives rise to superheating and a highly unstable thin film boiling process (pulsed vaporization). In other words, during heat transfer, the fluid under the cantilevers 202 experiences superheating followed by explosive evaporation. The thin film boiling under the cantilevers 202 is extremely fast due to the small thermal mass of the thin fluid layer and rapid replenishing by capillary pumping. The level of thermal-mechanical energy conversion in this structure is much higher than a free bubble expansion because of the capillary pressurization under the cantilevers 202. The rapid pulsation caused by the vaporization drives the cantilevers 202 into oscillation at ultrasonic frequencies, which violently agitates the surrounding fluid and gives rise to a dynamically modified surface configuration, leading to significant enhancement of surface evaporation.

The close spacing between the cantilevers 202 as shown in FIG. 2 forms local fluid transport channels and provides capillary pumping. The capillary pressure is determined by the spacing between the cantilevers 202, which can be designed to maximize the mass transfer. The optimal spacing depends on the island dimensions (the larger the island, the larger the spacing). As a particular example, one estimate based on a 1D capillary pumping model suggests that the optimal cantilever spacing is in the micron range for 100-micron islands (where a heat flux well above 500 W/cm$^2$ can be achieved in this modeled estimate).

The cantilevers 202 can be fabricated in any suitable manner. For example, the cantilevers 202 can be fabricated on silicon using well-established micro-fabrication processes. In this document, the term "cantilever" refers to a structure defining one or more spaces between itself and another structure, where the cantilever is supported (such as by being coupled to the other structure) at or near one end of each defined space. Additional features may also be added, such as surface treatment to control the nucleation process and the superheating temperature. In some embodiments, this thermal ground plane structure can be monolithically fabricated on silicon substrates, allowing quick testing and evaluation of the evaporator performance. In other embodiments, the evaporator structures can be bonded with a non-silicon casing with pre-fabricated fluidic channels.

Unlike conventional static wick structures, this dynamic wick structure greatly enhances heat transfer without reducing mass transport capacity (e.g. using a thinner or denser wick). This opens a new route to achieve extremely high effective thermal conductivity at unprecedented heat flux levels.

The dynamic wick structure illustrated in FIG. 2 particularly addresses the problem of a limited heat transfer coefficient of the evaporator due to poor thermal conductivity of the working fluid (such as water). The solution offered by the dynamic wick structure works by creating a strong surface agitation, which could attain an extremely high heat transfer coefficient without using ultra small pore sizes that restricts fluid flow, thus both high heat and mass transfer can be achieved. Among other things, the wick structure shown in FIG. 2 includes or supports:

Structures that facilitate a much higher degree of thermal-mechanical conversion than free bubble expansion;

Strong surface tension and hydrophilicity in the structures, which creates hydrodynamic instability prohibiting vapor trapping in the wick; and Dynamic enhancement of heat transfer.

Although FIG. 2 illustrates, additional details of one example vapor chamber thermal ground plane 100, various changes may be made to FIG. 2. For example, while FIG. 2 illustrates two example shapes of the cantilevers 202 (T-shaped and zigzag-shaped), these shapes are for illustration only. In fact, each structure in the thermal ground plane 100 could have any other size or shape.

FIGS. 3A through 3D illustrates an example operation of a cantilever 202 in a vapor chamber thermal ground plane 100 according to one embodiment of this disclosure. The cantilever 202 shown in FIG. 3 is for illustration only. Other cantilevers 202 that operate in the same or similar manner could be used in the vapor chamber thermal ground plane 100 without departing from the scope of this disclosure.

Figure 3A:
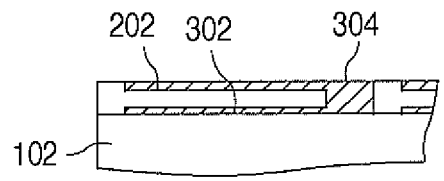
FIGS. 3A through 3D illustrate an example operation of a cantilever in a vapor chamber thermal ground plane according to one embodiment of this disclosure.
Figure 3B:
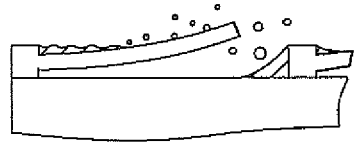
Figure 3C:
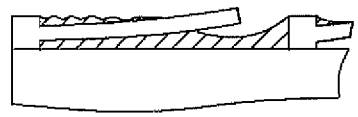
Figure 3D:

As shown in FIG. 3A, the cantilever 202 generally defines a space 302 between itself and its underlying evaporative island 102. A fluid 304 from the fluidic network 104 covers the cantilever 202 and fills the space 302. Due to the size and shape of the space 302, the fluid 304 between the cantilever 202 and the island 102 undergoes superheating during heat transfer. This results in explosive evaporation, which is shown in FIG. 3B. The explosive evaporation lifts the cantilever 202, and at least some of the fluid 304 previously in the space 302 escapes as vapor. As shown in FIGS. 3C and 3D, the cantilever 202 then returns to its resting position, and new fluid 304 enters the space 302. This process can be repeated numerous times to transfer heat away from the evaporative island 102.

Although FIGS. 3A through 3D illustrates one example of the operation of a cantilever 202 in a vapor chamber thermal ground plane 100, various changes may be made to FIGS. 3A through 3D. For example, the cantilever 202 could have any suitable size or shape.

Figure 4:
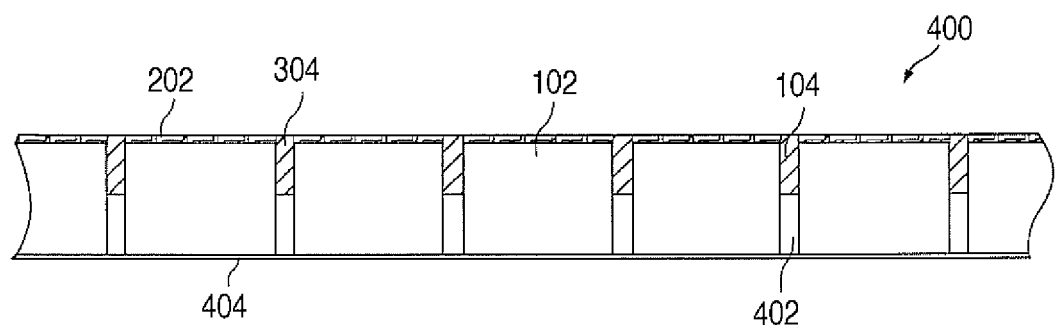
FIG. 4 illustrates an example vapor chamber thermal ground plane casing according to one embodiment of this disclosure.

FIG. 4 illustrates an example vapor chamber thermal ground plane casing 400 according to one embodiment of this disclosure. The embodiment of the casing 400 shown in FIG. 4 is for illustration only. Other embodiments of the thermal ground plane casing 400 could be used without departing from the scope of this disclosure.

As noted above, one common problem with conventional thermal management solutions involves TEC mismatch between an integrated circuit substrate and the thermal ground plane. Although a silicon substrate represents the perfect TEC match with silicon chips, large silicon substrates are rigid, fragile, and hard to handle. In addition, as a low-bandgap semiconductor, it is not suitable for high-voltage insulation and can be lossy for radio frequency (RF) applications.

As shown in FIG. 4, a technique is used to bind the above-described dynamic wick structure (the evaporative islands 102) to form a flexible tile casing 400. In some embodiments, the islands 102 represent silicon islands, thereby forming a flexible tiled silicon casing.

In this example, the tiled casing 400 is monolithically fabricated with the fluidic network 104 and the evaporative islands 102. As shown here, the channels between the islands 102 include an adhesive or other binder 402, such as a polymer binder, that bonds the islands 102 together but leaves sufficient channel depth to meet the capillarity requirements for the fluid in the fluidic network 104. Also included is a diffusion barrier 404, such as a dielectric or metal coating, which can be used to help prevent out diffusion of the working fluid.

The structures in the casing 400 are completely monolithic in this example. This can achieve excellent TEC matching, significant flexibility (such as plastic-like flexibility), good electrical insulation, and toughness and ruggedness (making the thermal ground plane 100 suitable for practical use). The toughness and ruggedness of the tiled structure also enables much smaller wall thickness than using rigid and brittle materials. This results in a thinner thermal ground plane design and smaller thermal resistance across the wall. Using different binders 402, the casing 400 can be made semi-rigid or extremely flexible for various applications. Because of its compliant nature, the thermal ground plane 100 can be used with chips other than silicon, such as GaAs and GaN, where TEC mismatch will not cause excessive stress.

Although FIG. 4 illustrates one example of a vapor chamber thermal ground plane casing 400, various changes may be made to FIG. 4. For example, the cantilevers on the islands 102 could have any suitable size or shape. Also, the islands 102 could have any suitable size or shape. In addition, any suitable technique could be used to bind individual islands 102 together, or the islands 102 could be formed on a single substrate.

In various embodiments of the thermal ground plane 100, the capillary pressure generated by the wick structure may vary inversely with the characteristic pore size of the wick, so available capillary pressure can be increased simply by making features that are smaller than those currently used. This appears well-suited to take advantage of advances in micro- and nano-fabrication technologies that have proliferated in recent years. Simply making the pore size ever smaller does not automatically create structures with improved performance, however, because the fluid experiences higher pressure drop as the pores become smaller. This suggests an optimal pore size exists between making extremely small pores for generation of higher capillary pressure and keeping larger pores that incur less pressure drop on the fluid phase. An optimal design can incorporate multiple pore scales and flow paths that keep the wick supplied with fluid to high heat flux levels.

Also, reducing the thickness of a vapor space in a vapor chamber may increase the vapor phase pressure drop. For thicknesses below 1 mm, this effect can be very strong and ultimately produce large temperature gradients that degrade the performance of the vapor chamber. To mitigate this problem, a working fluid can be chosen with high vapor density, high heat of vaporization, and low vapor viscosity.

In addition to being compatible with the working fluid, the envelope (casing 106) may be structurally capable of containing the working fluid. In general, this can mean withstanding either positive internal or external pressure, although with water the pressure is usually external in the presence of atmospheric air pressure at temperatures typical of cooling of ordinary silicon-based electronics.

Without any special features, an open wick may only be able to hold fluid against hydraulic pressure no larger than the capillary pressure of the largest channels (e.g. the channels of the fluidic network 104). For example, if the channels are 20 microns wide, it can only hold water against 0.08 bar, while the pressure drop over a 20 cm distance under 20 G is about 0.4 bar. A potential solution is to encapsulate the transport channels and cover the evaporative islands 102 with a gas permeable hydrophobic membrane. In this way, the only possible location for fluid escape is a condenser. However, this can only happen when the hydraulic pressure exceeds the capillary pressure of the evaporator wick or through a cavitation in the fluidic channels. The first possibility can be easily eliminated using sufficient capillary pressure for the evaporative wick. For water, a <4 micron pore or channel size would provide over 0.4 bar holding pressure. The cavitation possibility can be prevented by increasing the gas phase pressure over the fluid surface.

For metallic casings 106, soldering or direct low temperature bonding can be used to form a hermetically sealed case. A variety of polymer bonding techniques can also be used to seal polymer structures, such as thermal, adhesive, and chemically assisted bonding. To attain structural requirements for large thermal ground planes, internal supports may also be designed into the casing 106 to reinforce the thermal ground plane to withstand, for example, 20 G accelerations.

The various elements shown in FIGS. 1 through 4 could have any suitable size, shape, and dimensions. As a particular example, each of the evaporative islands 102 in the wick structure could be approximately 100 microns by 100 microns or 200 microns by 200 microns. Moreover, the wick structure could be used in defense, space, and other applications. IC chips and MCMs can be hard-bonded to the disclosed structure with minimum thermal resistance. The low profile (thinness) of the structure allows high pack density of electronics, which may be needed for space and other applications. In these or other embodiments, Micro Electro-Mechanical System (MEMS) technology can also be used to fabricate the thermal ground plane.

Figure 5A:
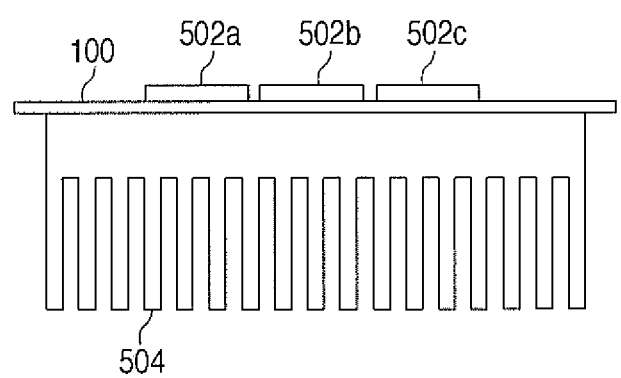
FIGS. 5A and 5B illustrate example systems having a vapor chamber thermal ground plane according to one embodiment of this disclosure.
Figure 5B:
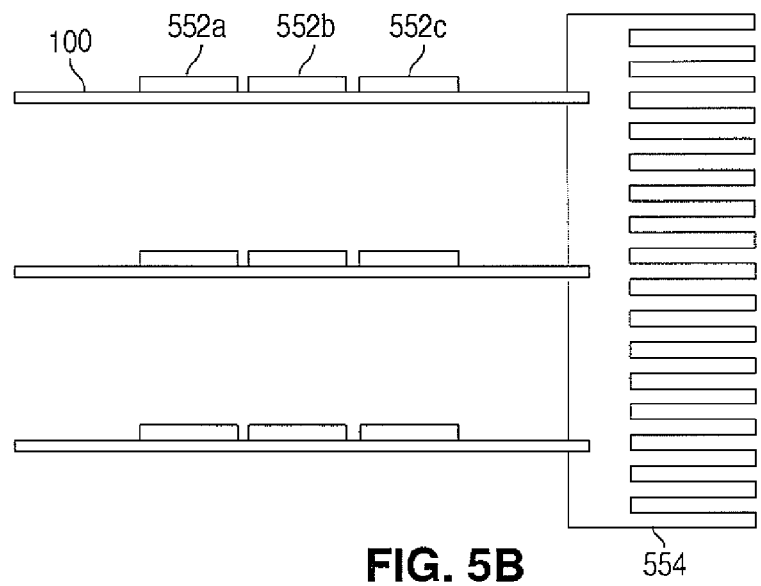

FIGS. 5A and 5B illustrate example systems 500 and 550 having a vapor chamber thermal ground plane according to one embodiment of this disclosure. The embodiments of the systems 500 and 550 shown in FIGS. 5A and 5B are for illustration only. Other embodiments of the systems 500 and 550 could be used without departing from the scope of this disclosure.

In FIG. 5A, various integrated circuit chips 502a-502c are mounted on the vapor chamber thermal ground plane 100. The integrated circuit chips 502a-502c could represent individual chips or chips forming larger multi-chip modules. The integrated circuit chips 502a-502c could represent any suitable semiconductor chips and can perform any suitable function(s). As particular examples, the integrated circuit chips 502a-502c could represent central processing units or other data processing devices. The integrated circuit chips 502a-502c generate heat, which is absorbed and spread by the thermal ground plane 100 as described above. Thermal grease or other conductive material could be placed between the integrated circuit chips 502a-502c and the thermal ground plane 100 to ensure that a thermal path exists between the thermal ground plane 100 and the integrated circuit chips 502a-502c.

Also attached to the thermal ground plane 100 is a heat sink 504. The heat sink 504 generally absorbs heat from the thermal ground plane 100 and dissipates the heat. For example, the heat sink 504 can receive and dissipate the heat from the thermal ground plane 100 into the surrounding environment, typically through a fan structure on the exposed side of the heat sink 504. The heat sink 504 includes any suitable structure for dissipating heat from the thermal ground plane 100.

In FIG. 5B, multiple vapor chamber thermal ground planes 100 are provided, and integrated circuit chips 552a-552c are mounted on each of the thermal ground planes 100. Each of the thermal ground planes 100 is also in thermal contact with a heat sink 554. The integrated circuit chips 552a-552c could represent any suitable semiconductor chips and can perform any suitable function(s), and any number of chips could be placed on each thermal ground plane 100. The heat sink 554 includes any suitable structure for dissipating heat from the thermal ground plane 100.

Although FIGS. 5A and 5B illustrate two examples of systems 500 and 550 having a vapor chamber thermal ground plane, various changes may be made to FIGS. 5A and 5B. For example, any integrated circuitry or other structures that require cooling could be used with a thermal ground plane 100. Also, a thermal ground plane 100 could be used in any other system to cool any other structures or devices. In addition, FIGS. 5A and 5B illustrate merely two of many possible configurations or implementations of the thermal ground plane.

Figure 6:
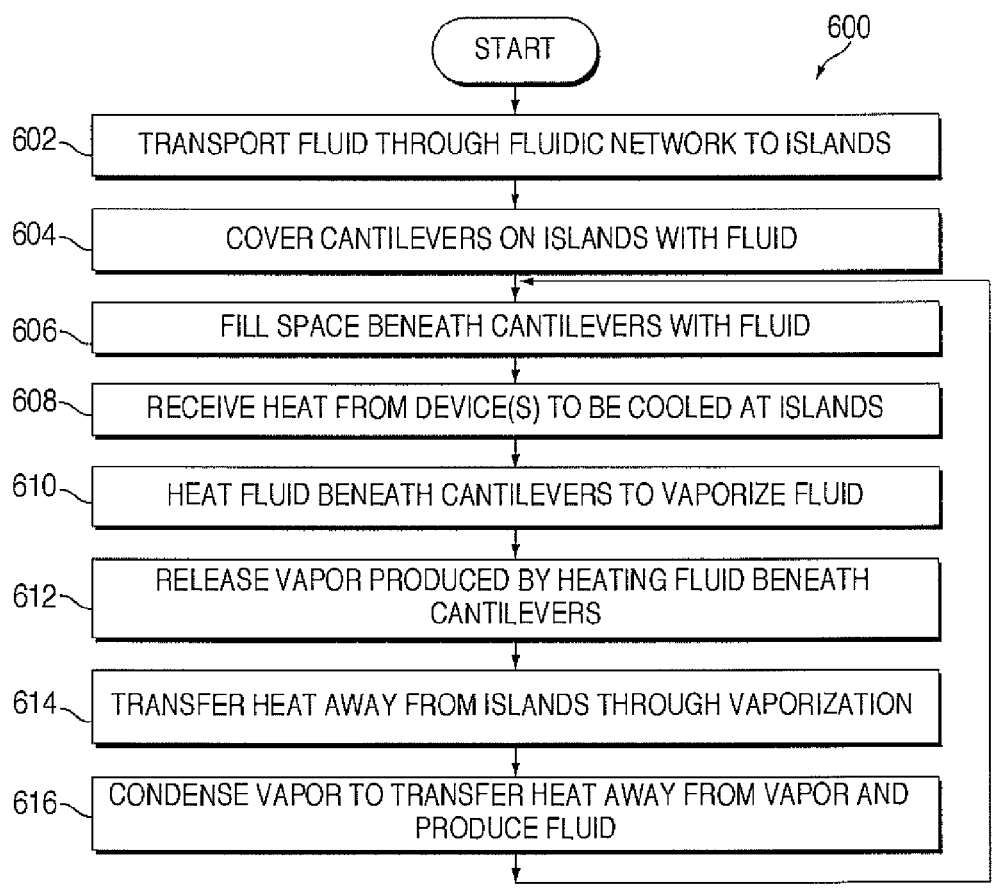
FIG. 6 illustrates an example method for thermal management using a vapor chamber thermal ground plane according to one embodiment of this disclosure.

FIG. 6 illustrates an example method 600 for thermal management using a vapor chamber thermal ground plane according to one embodiment of this disclosure. The embodiment of the method 600 shown in FIG. 6 is for illustration only. Other embodiments of the method 600 could be used without departing from the scope of this disclosure.

Fluid is transported through a fluidic network in a thermal ground plane at step 602. This could include, for example, using a high mass-transport fluidic network 104 to transport a cooling fluid (such as water) to various evaporative islands 102 in the thermal ground plane 100. The fluid from the fluidic network covers cantilevers on the islands at step 604 and fills spaces beneath the cantilevers (between the cantilevers and the islands) at step 606. Capillary forces could cause movement of the fluid around and under the cantilevers here.

Heat from one or more devices to be cooled is received at the islands at step 608. This could include, for example, operating one or more integrated circuit chips, multi-chip modules, or other circuitry. The heat is transported from the chips or other circuitry to the evaporative islands 102. The fluid beneath the cantilevers is heated by the islands and vaporized at step 610. This causes the release of vaporized fluid from beneath the cantilevers at step 612 and the transfer of heat away from the islands through the vaporization at step 614. The vapor is later condensed to transfer heat away from the vapor and reclaim fluid at step 616. At this point, the method 600 returns to step 606 to again fill the spaces beneath the cantilevers with fluid.

Although FIG. 6 illustrates one example of a method 600 for thermal management using a vapor chamber thermal ground plane, various changes may be made to FIG. 6. For example, while shown as a series of steps, various steps in FIG. 6 could overlap or occur in parallel.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of the invention, as defined by the following claims.

What is claimed is:

1. An apparatus comprising:
one or more islands each having a surface with multiple cantilevers; and
a fluidic network configured to provide liquid over the surface of each island with the cantilevers;
wherein the one or more islands include a first island, the surface of the first island including a first cantilever of the multiple cantilevers, the first cantilever including a first end and a second end, the first end fixed to the surface of the first island, the second end suspended over the surface of the first island, the second end configured to oscillate in response to vaporization of at least some of the liquid present between the surface of the first island and the first cantilever.

2. The apparatus of claim 1, wherein the cantilevers define semi-confined spaces between the cantilevers and the one or more islands, the semi-confined spaces configured to be at least partially filled by the liquid.

3. The apparatus of claim 1, wherein the apparatus is configured so that heat from the one or more islands vaporizes at least some of the liquid between the cantilevers and the one or more islands.

4. The apparatus of claim 3, wherein the apparatus further comprises a vapor chamber configured to retain vapor resulting from vaporizing the at least some of the liquid.

5. The apparatus of claim 3, wherein the cantilevers are configured to oscillate based on the vaporization of the liquid and to agitate the surrounding liquid based on the oscillation.

6. The apparatus of claim 1, wherein the fluidic network is configured to transport the liquid by capillary forces.

7. The apparatus of claim 1, wherein the cantilevers are configured to oscillate at ultrasonic frequencies in response to vaporization of at least some of the liquid.

8. A system comprising:
a thermal ground plane comprising:
one or more islands each having a surface with multiple cantilevers; and
a fluidic network configured to provide liquid over the surface of each island with the cantilevers;
wherein the one or more islands include a first island, the surface of the first island including a first cantilever of the multiple cantilevers, the first cantilever including a first end and a second end, the first end fixed to the surface of the first island, the second end suspended over the surface of the first island, the second end configured to oscillate in response to vaporization of at least some of the liquid present between the surface of the first island and the first cantilever; and
a heat sink configured to dissipate heat from the thermal ground plane.

9. The system of claim 8, further comprising:
integrated circuitry, wherein the thermal ground plane is configured to absorb heat from the integrated circuitry.

10. The system of claim 9, wherein the thermal ground plane is configured so that the absorbed heat vaporizes at least some of the liquid between the cantilevers and the one or more islands.

11. The system of claim 8, wherein the cantilevers define semi-confined spaces between the cantilevers and the one or more islands, the semi-confined spaces configured to be at least partially filled by the liquid.

12. The system of claim 11, wherein the cantilevers are configured to oscillate based on vaporization of at least some of the liquid in the semi-confined spaces and to agitate the surrounding liquid based on the oscillation.

13. The system of claim 11, wherein the cantilevers are configured to oscillate at ultrasonic frequencies in response to vaporization of at least some of the liquid in the semi-confined spaces.

14. The system of claim 8, wherein the thermal ground plane further comprises a vapor chamber configured to retain vapor resulting from vaporizing the at least some of the liquid.

15. The system of claim 8, wherein the fluidic network is configured to transport the liquid by capillary forces.

16. A method comprising:
providing a liquid to a surface of at least one island, the surface of the at least one island having multiple cantilevers; and
vaporizing at least some of the liquid between the cantilevers and the surface of the at least one island;
wherein the at least one island includes a first island, the surface of the first island including a first cantilever of the multiple cantilevers, the first cantilever including a first end and a second end, the first end fixed to the surface of the first island, the second end suspended over the surface of the first island; and
wherein vaporizing at least some of the liquid present between the surface of the first island and the first cantilever causes the second end of the first cantilever to oscillate.

17. The method of claim 16, wherein vaporizing at least some of the liquid between the cantilevers and the at least one island transports heat away from the at least one island.

18. The method of claim 16, further comprising:
agitating liquid surrounding the first cantilever in response to oscillating the second end of the first cantilever.

19. The method of claim 16, wherein:
the cantilevers define semi-confined spaces between the cantilevers and the at least one island, the semi-confined spaces at least partially filled by the liquid; and
vaporizing at least some of the liquid comprises vaporizing at least some of the liquid in the semi-confined spaces.

20. The method of claim 16, wherein providing the liquid to the surface of the at least one island comprises transporting the liquid in a fluidic network by capillary forces.

21. The method of claim 16, further comprising:
condensing the vaporized liquid back into a liquid form.

* * * * *